US007602220B1

(12) United States Patent
Bofill-Petit et al.

(10) Patent No.: US 7,602,220 B1
(45) Date of Patent: Oct. 13, 2009

(54) RESISTOR-INPUT TRANSCONDUCTOR INCLUDING COMMON-MODE COMPENSATION

(75) Inventors: Adrià Bofill-Petit, Barcelona (ES); Robert K. Henderson, Edinburgh (GB); Jonathan Ephriam David Hurwitz, Edinburgh (GB)

(73) Assignee: Gigle Semiconductor, Ltd., Edinburgh (GB)

( * ) Notice: Subject to any disclaimer, the term of this patent is extended or adjusted under 35 U.S.C. 154(b) by 0 days.

(21) Appl. No.: 12/145,475

(22) Filed: Jun. 24, 2008

(51) Int. Cl.
*H02M 11/00* (2006.01)
(52) U.S. Cl. .................................... 327/103
(58) Field of Classification Search ............ 327/103; 330/258
See application file for complete search history.

(56) References Cited

U.S. PATENT DOCUMENTS

| | | | |
|---|---|---|---|
| 4,636,711 A | 1/1987 | Freymuth | |
| 4,772,870 A | 9/1988 | Reyes | |
| 5,552,729 A * | 9/1996 | Deguchi | 327/103 |
| 5,552,730 A * | 9/1996 | Deguchi | 327/103 |
| 5,574,748 A | 11/1996 | Vander Mey et al. | |
| 5,598,117 A * | 1/1997 | Deguchi | 327/103 |
| 5,777,544 A | 7/1998 | Vander Mey et al. | |
| 5,929,750 A | 7/1999 | Brown | |
| 5,933,071 A | 8/1999 | Brown | |
| 6,014,386 A | 1/2000 | Abraham | |
| 6,243,413 B1 | 6/2001 | Beukema | |
| 6,356,152 B1 * | 3/2002 | Jezdic et al. | 330/253 |
| 6,373,377 B1 | 4/2002 | Sacca et al. | |
| 6,496,067 B1 * | 12/2002 | Behzad et al. | 330/261 |
| 6,985,715 B2 | 1/2006 | Lee | |
| 7,042,351 B2 | 5/2006 | Kline | |
| 7,053,756 B2 | 5/2006 | Mollenkopf et al. | |
| 7,075,414 B2 | 7/2006 | Giannini et al. | |
| 7,274,916 B2 * | 9/2007 | Al-Shyoukh et al. | 455/130 |
| 7,391,317 B2 | 6/2008 | Abraham et al. | |
| 2002/0154000 A1 | 10/2002 | Kline | |
| 2003/0016123 A1 | 1/2003 | Tager et al. | |
| 2003/0129978 A1 | 7/2003 | Akiyama et al. | |
| 2003/0133473 A1 | 7/2003 | Manis et al. | |

(Continued)

FOREIGN PATENT DOCUMENTS

EP 0580457 A1 1/1994

(Continued)

OTHER PUBLICATIONS

Yukitoshi, Sanada, A Multiuser Interference Cancellation Technique Utilizing Convolutional Colds and Orthogonal Multicarrier Modulation for Wireless Indoor Communications, IEEE Journal of Selected Areas in Communications, vol. 14, No. 8, Oct. 1996, pp. 1500-1508.

(Continued)

*Primary Examiner*—Lincoln Donovan
*Assistant Examiner*—William Hernandez
(74) *Attorney, Agent, or Firm*—Peters Verny, LLP

(57) ABSTRACT

A resistor-input transconductor includes a circuit configured to generate a common-mode compensation current. The common-mode compensation current is used to compensate for the common-mode voltage of the inputs. A current output of the resistor-input transconductor is proportional to a voltage difference between the two inputs and essentially independent of a common-mode voltage of the two inputs. The resistor input transconductor may be applied in a variety of applications including, for example, communications.

22 Claims, 6 Drawing Sheets

U.S. PATENT DOCUMENTS

| | | |
|---|---|---|
| 2003/0169155 A1 | 9/2003 | Mollenkopf et al. |
| 2003/0224728 A1 | 12/2003 | Heinonen et al. |
| 2004/0047427 A1 | 3/2004 | Dostert et al. |
| 2004/0107588 A1 | 6/2004 | Pu |
| 2004/0113756 A1 | 6/2004 | Mollenkopf |
| 2004/0113757 A1 | 6/2004 | White, II et al. |
| 2004/0174851 A1 | 9/2004 | Zalitzky et al. |
| 2004/0246107 A1 | 12/2004 | Kline |
| 2005/0089061 A1 | 4/2005 | Logvinov et al. |
| 2005/0141473 A1 | 6/2005 | Lim et al. |
| 2006/0038662 A1 | 2/2006 | White, II et al. |
| 2006/0097574 A1 | 5/2006 | Gidge et al. |
| 2006/0120399 A1 | 6/2006 | Claret et al. |
| 2006/0126617 A1 | 6/2006 | Cregg et al. |

FOREIGN PATENT DOCUMENTS

| | | |
|---|---|---|
| EP | 1134909 A1 | 9/2001 |
| EP | 1351408 B1 | 10/2003 |
| EP | 1388954 A2 | 2/2004 |
| EP | 1531568 A1 | 5/2005 |
| EP | 1548974 A2 | 6/2005 |
| EP | 1432138 B1 | 9/2005 |
| WO | 0195518 A2 | 12/2001 |
| WO | 03015291 A2 | 2/2003 |
| WO | 03077443 A1 | 9/2003 |
| WO | 03092212 A1 | 11/2003 |
| WO | 2004100392 A1 | 11/2004 |
| WO | 2005039070 A2 | 4/2005 |
| WO | 2006017743 A2 | 2/2006 |
| WO | 2006074174 A1 | 7/2006 |

OTHER PUBLICATIONS

Gardner, S., et al., HomePlug Standard Brings Networking to the Home, CSD, Dec. 2000.

UPA—Universal Powerline Association, Frequently Asked Questions, date unknown.

Powerstream Technology Background, Adaptive Networks, Inc., 2002.

Stelts, Michael, CEPCA Standard Summary, 2006.

Digital Home Standard, Universal Powerline Association (UPA), 2005.

Powerline Communications Systems-Access/In-home & In-home/In-home Coexistence Mechanism-General Specifications, Universal Powerline Association (UPA), Jun. 27, 2005.

Opera Technology Specification—Part 1, Open PLC European Research Alliance (OPERA), Jan. 31, 2006.

Opera System Specification—Part 2, Open PLC European Research Alliance (OPERA), Jan. 31, 2006.

HomePlug AV White Paper, HomePlug Powerline Alliance, 2005.

Juttner, A., et al., Tree Based Broadcast in Ad Hoc Networks, Sep. 9, 2004, pp. 1-21, Errisson Research, Traffic Analysis and Network Performance Laboratory, Budapest, Hungary.

Kouvatsos, D., et al., Broadcasting Methods in Ad Hoc Networks: An Overview, Proceeding of the 3rd International Working conference on Performance Modelling and Evaluation of Heterogeneous Networks, Jul. 20, 2005, pp. 1-14.

* cited by examiner

RESISTOR-INPUT TRANSCONDUCTOR INCLUDING COMMON-MODE COMPENSATION

BACKGROUND

1. Field of the Invention

The invention is in the field of electronics and more specifically in the field of signal-processing systems.

2. Related Art

A transconductor is a circuit configured to generate an output current proportional to an input voltage. Transconductors are commonly used for signal detection in applications such as communications, sensors, signal processing, et cetera. High linearity between the input voltage and output current is important to many applications. Transconductors are characterized by the frequency range and voltage range over which a linear output is produced.

FIG. 1 is a conceptual illustration of a Transconductor 100 of the prior art. Transconductor 100 includes a differential voltage input 110 at which voltages $V_{inp\ (input\ p)}$ and $V_{inn\ (input\ n)}$ are applied. These voltages are received by a Buffer 120. Buffer 120 is an active circuit used to reproduce the difference between $V_{inn}$ and $V_{inp}$ across a Resistor 130 of resistance R. This results in a current $i_R$ through Resistor 130. The current $i_R$ is replicated by a Current Source 140 that provides a current proportional to the difference between $V_{inn}$ and $V_{inp}$ at an Output 150.

Transconductor 100 may be limited in the range of input voltages that can converted to a linearly proportional output current. For example, if the voltage difference $|V_{inn}-V_{inp}|$ is close to or greater than a supply voltage ($V_{cc}$) of Buffer 120, then Transconductor 100 may not be able to reliably detect these voltages. One solution to this problem is to convert the input voltage signal into a current signal relative to a "virtual ground" before it enters the active section of the transconductor circuit. The differences between each of $V_{inn}$ and $V_{inp}$ and the virtual ground determine the values of the current signals. In this approach, the difference between each of $V_{inn}$ and $V_{inp}$ and the virtual ground is not limited to being less than $V_{cc}$. The virtual ground is preferably set close to the input "common-mode voltage." The common-mode voltage is the voltage that $V_{inn}$ and $V_{inp}$ have in common and can be defined as $V_{incm}=(V_{inp}+V_{inn})/2$.

FIG. 2 is a conceptual illustration of a Transconductor 200 of the prior art including a virtual ground voltage ($V_{vg}$). The virtual ground is established by a Voltage Source 210 configured to provide a potential $V_{vg}$ relative to a Common Ground 220. $V_{inp}$ and $V_{inn}$ are applied to a Resistor 230 and a Resistor 240, respectively, which are characterized by resistances $R_p$ and $R_n$. A current $i_{Rp}$ passes through Resistor 230, where $i_{Rp}=(V_{inp}-V_{vg})/R_p$. Likewise, a current $i_{Rn}$ passes through the Resistor 240, where $i_{Rn}=(V_{inn}-V_{vg})/R_n$. A Current Source 250 is used to replicate $i_{Rp}$ at an Output 270 and a Current Source 260 is used to replicate $i_{Rn}$ at an Output 280.

The voltage at the virtual ground $V_{vg}$ is kept constant over a range of possible values of current inputs ($i_{Rp}$ and $i_{Rn}$). The combined currents through the input resistors $R_p$ and $R_n$ can be expressed in terms of a common-mode voltage ($V_{incm}$) and a differential-mode voltage ($V_{indiff}$) as follows:

$$i_{rp} = \frac{V_{indiff}}{2R_p} + \frac{V_{in\,cm} - V_{vg}}{R_p} \qquad \text{Equ. 1}$$

$$i_{rn} = \frac{V_{indiff}}{2R_n} + \frac{V_{in\,cm} - V_{vg}}{R_n} \qquad \text{Equ. 2}$$

where $V_{incm}=(V_{inp}+V_{inn})/2$ and $V_{indiff}=V_{inp}-V_{inn}$.

The output currents $i_{outp}$ and $i_{outn}$ are, therefore, a sum of a component proportional to the signal of interest (the differential voltage $V_{indiff}$) and an undesired common-mode component ($V_{incm}-V_{vg}$).

In addition to the presence of the undesired common-mode component, a problem with the approach illustrated in FIG. 2 is that $V_{vg}$ should be as close to the input common-mode voltage as possible. This can require a costly off-chip voltage source. Further, if the input voltages include high frequency components, $V_{vg}$ must track these components. This is difficult to do using an external voltage source or when there are other sources of high frequency noise, and places further costs and restrictions on the system.

In some cases AC coupling is used to eliminate a DC common-mode voltage. However, this approach may require costly external components or limit the frequency bandwidth of the system.

Transconductors are sometimes used in systems in which the strength of incoming signals may vary considerably. For example, in computing networks, electrical or optical signals may be attenuated by different amounts depending on factors such as the distance traveled from a source. As such, the peak voltages at a receiver may vary by several decades, e.g. 70 dB or more. In applications requiring a high data throughput it may also be desirable to use fast low-voltage circuitry, such as CMOS circuits having a maximum supply voltage of 3.3 Volts or lower. This places further limitations on the transconductor.

SUMMARY

The invention includes systems and methods of generating output currents that are proportional to a voltage differential between two inputs. These output currents are compensated for common-mode voltage between the inputs and in some embodiments allow for a wider dynamic range in convertible input voltages and/or frequencies relative to the prior art. The compensation is achieved by generating a common-mode current using a combination of currents received from each of the inputs. The common-mode current is then fed back (or forward) to compensate for the common-mode components in currents generated from each voltage input individually.

A resistor-input transconductor includes at least three components: a first component configured to generate a current proportional to a first voltage input, a second component configured to generate a current proportional to a second voltage input, and a third component configured to generate a common-mode-compensation current proportional to an input that is a combination of the first and second voltage inputs. The common-mode-compensation current can be used at either the input or the output of the first and second components to compensate for the common-mode voltage. The third component allows for common-mode-compensation independent of an external common-mode input voltage.

Various embodiments of the invention include a communication device in which the resistor-input transconductor is used to detect communication signals. For example, some embodiments include a network communication device in which data encoded signals are received over various transmission distances. Because the distance traveled affects the magnitude of the received signals, these signals may vary over a wide dynamic range. Further applications in which the various embodiments of the invention may be used include detection of electro-magnetic signals (e.g., radio, radar, photonic signals, etc.), detection of signals from sensors, detection of signals from photo detectors, communication over power lines or other electrical conductors, or any other application wherein resistor-input transconductors have been used in the prior art.

Various embodiments of the invention include a system comprising: a first voltage input; a second voltage input; a first voltage-to-current converter comprising: a first circuit configured to provide a virtual ground, an input resistor $R_p$ disposed between the first voltage input and the virtual ground, and a circuit configured to generate an output current $I_{outp}$ responsive to current flowing through the resistor $R_p$; a second voltage-to-current converter comprising: a second circuit configured to provide the virtual ground, an input resistor $R_n$ disposed between the second voltage input and the virtual ground, and a circuit configured to generate an output current $I_{outn}$ responsive to current flowing through the resistor $R_n$; a third voltage-to-current converter comprising: a third circuit configured to provide the virtual ground, an input resistor $R_{cmp}$ disposed between the first voltage input and the virtual ground. an input resistor $R_{cmn}$ disposed between the second voltage input and the virtual ground, and a circuit configured to combine currents flowing through the input resistors $R_{cmp}$ and $R_{cmn}$, and to generate an output current $I_{Rcm}$ proportional to the combined currents; and a circuit configured to provide the output current $I_{Rcm}$ to the first voltage-to-current converter and the second voltage-to-current converter so as to compensate for the common-mode voltage of the first voltage input and the second voltage input.

Various embodiments of the invention include a system comprising: means for receiving a first input voltage and generating a first output current using the first input voltage; means for receiving a second input voltage and generating a second output current using the second input voltage; means for generating a common-mode current representative of a common-mode voltage of the first input voltage and the second input voltage; and means for providing the common-mode current to the means for generating a first output current and to the means for generating a second output current, such that the first output current and the second output current are compensated for the common-mode voltage.

Various embodiments of the invention include a method comprising the steps of: receiving a first voltage at a first input; applying the first voltage to a first input resistor to generate a first input current; receiving a second voltage at a second input; applying the second voltage to a second input resistor to generate a second input current; generating a common-mode current representative of a common-mode voltage of the first voltage and the second voltage; using the first input current and the common-mode current to generate a first output current; and using the second input current and the common-mode current to generate a second output current, a difference between the first output current and the second output current being proportional to a difference between the first voltage and the second voltage.

DETAILED DESCRIPTION

Various embodiments of the invention include generation of a current representative of an input common-mode voltage. This current is referred to herein as "$i_{Rcm}$." At least two different approaches may be used to compensate for the common-mode voltage using $i_{Rcm}$. In a first approach $i_{Rcm}$ is fed forward to cancel the common-mode component of a transconductor output. In a second approach $i_{Rcm}$ is fed back and subtracted from the input currents entering the virtual ground nodes. It will be apparent to one of ordinary skill in the art that $i_{Rcm}$ may be used to compensate for the input common-mode voltage using alternative approaches.

Figure 1:
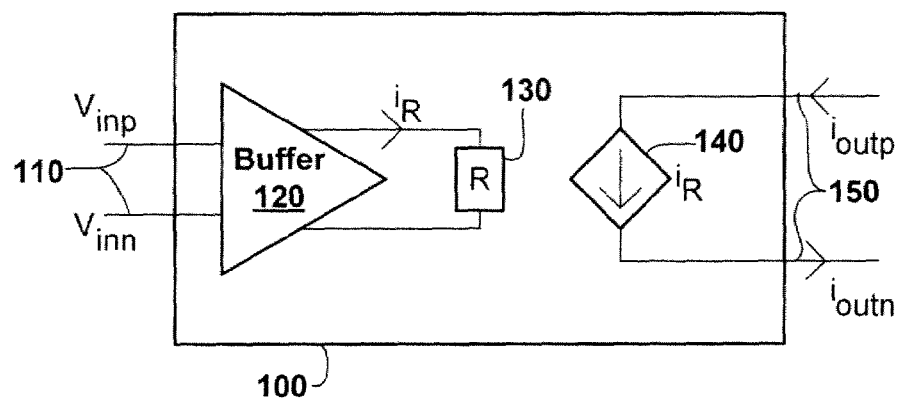
FIG. 1 is a conceptual illustration of a transconductor of the prior art.
Figure 2:
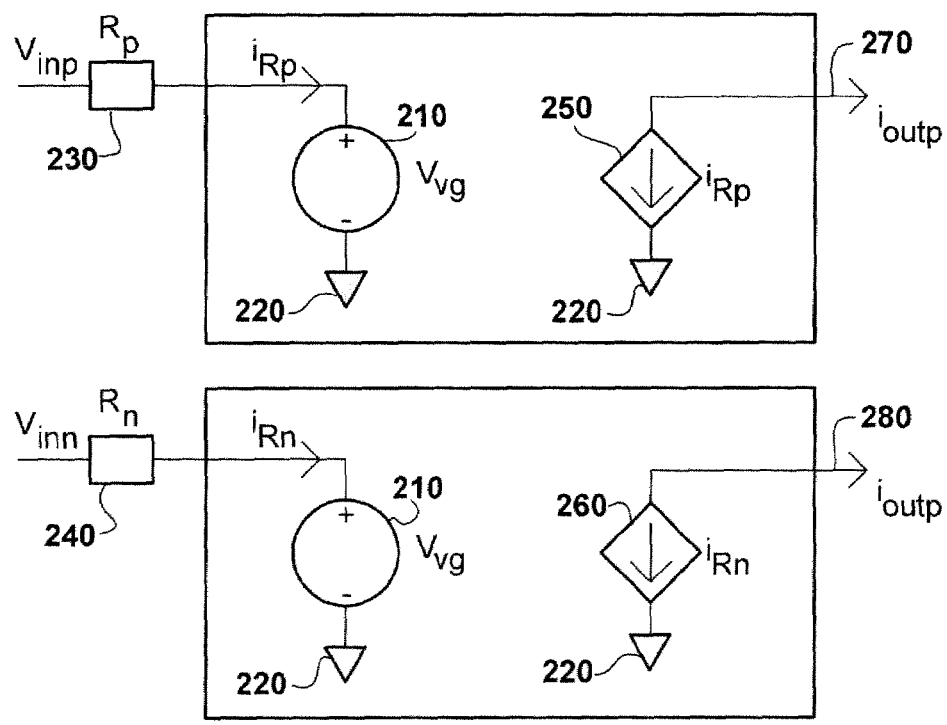
FIG. 2 is a conceptual illustration of a transconductor of the prior art including a virtual ground voltage.
Figure 3:
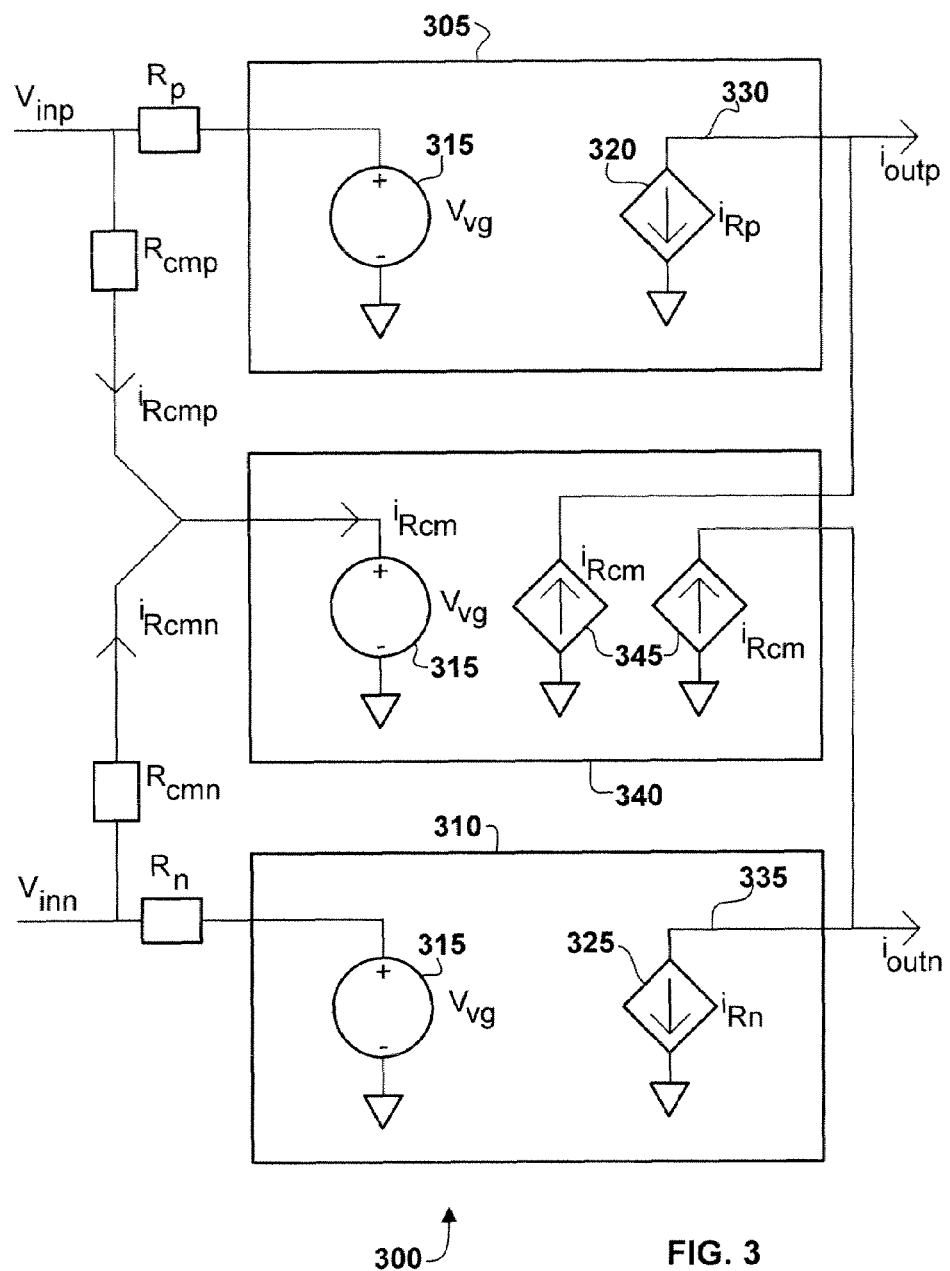
FIG. 3 is a conceptual illustration of a transconductor including common-mode compensation, according to various embodiments of the invention.

FIG. 3 is a conceptual illustration of a Transconductor 300 including common-mode compensation, according to various embodiments of the invention. In these embodiments, $i_{Rcm}$ is fed forward to cancel the common-mode current of the transconductor output. Transconductor 300 includes three current-copying components. A first Current-copying Component 305 is configured to receive a current $I_{Rp}$ generated by applying $V_{inp}$ to a Resistor $R_p$. A second Current-copying Component 310 is configured to receive a current $I_{Rn}$ generated by applying $V_{inn}$ to a Resistor $R_n$. Each of Current-copying Component 305 and 310 include a virtual ground $V_{vg}$ established by a Voltage Source 315. The currents $I_{Rn}$ and $I_{Rp}$ are a function of the resistances of Resistor $R_n$ and Resistor $R_p$ and $V_{vg}$. Current-copying Component 305 and 310 further include a separate Current Source 320 and 325, respectively. Current Sources 320 and 325 are configured to reproduce the currents $I_{Rn}$ and $I_{Rp}$ at Outputs 330 and 335 of Current-copying Components 305 and 310.

A third Current-copying Component 340 is configured to generate a current $i_{Rcm}$ representative of those parts of currents $I_{Rn}$ and $I_{Rp}$ due to the input common-mode voltage. Current $i_{Rcm}$ is subtracted from each of the currents $I_{Rn}$ and $I_{Rp}$. This process compensates for the common-mode voltage and allows Transconductor 300 to overcome various disadvantages of the prior art.

Current-copying Component 340 receives a current $i_{Rcmp}$ generated by applying $V_{inp}$ and $V_{vg}$ across a resistor $R_{cmp}$. Current-copying Component 340 also receives a current $i_{Rcmn}$ generated by applying $V_{inn}$ and $V_{vg}$ across a resistor $R_{cmn}$. The currents $i_{Rcmp}$ and $i_{Rcmn}$ are combined to produce a current $i_{Rcm}$. The current $i_{Rcm}$ is twice reproduced using two Current Sources 345 within Current-copying Component 340. These currents are then combined with $i_{Rn}$ and $i_{Rp}$ to produce output currents $i_{outn}$ and $i_{outp}$, respectively.

The cancellation of the common-mode voltage can be illustrated as follows. $R_{cmp}$ and $R_{cmn}$ can be selected to have equal resistances, referred to as $R_{cm}$. Thus, $$R_{cmp} = R_{cmn} 32 R_{cm}$$

$I_{Rcm}$ can then be expressed as, $$i_{Rcm} = \frac{V_{inp} - V_{vg}}{R_{cm}} + \frac{V_{inn} - V_{vg}}{R_{cm}}$$

or as a function of the common-mode voltage $V_{incm}=(V_{inp}+V_{inn})/2$, $$i_{rcm} = \frac{2(V_{incm} - V_{vg})}{R_{cm}} \quad \text{Equ. 3}$$

Now, selecting:

$$R_{cm}=2R_p=2R_n$$

and subtracting Equation 3 from each of Equations 1 and 2 the output currents $i_{outp}$ and $i_{outn}$ can be expressed as:

$$i_{outp} = \frac{V_{indiff}}{2R_p} \text{ and } i_{outn} = -\frac{V_{indiff}}{2R_n}$$

Thus, $i_{outp}$ and $i_{outn}$ are functions of the desired value $V_{indiff}$ and are independent of the common-mode voltage $V_{incm}$.

Figure 4:
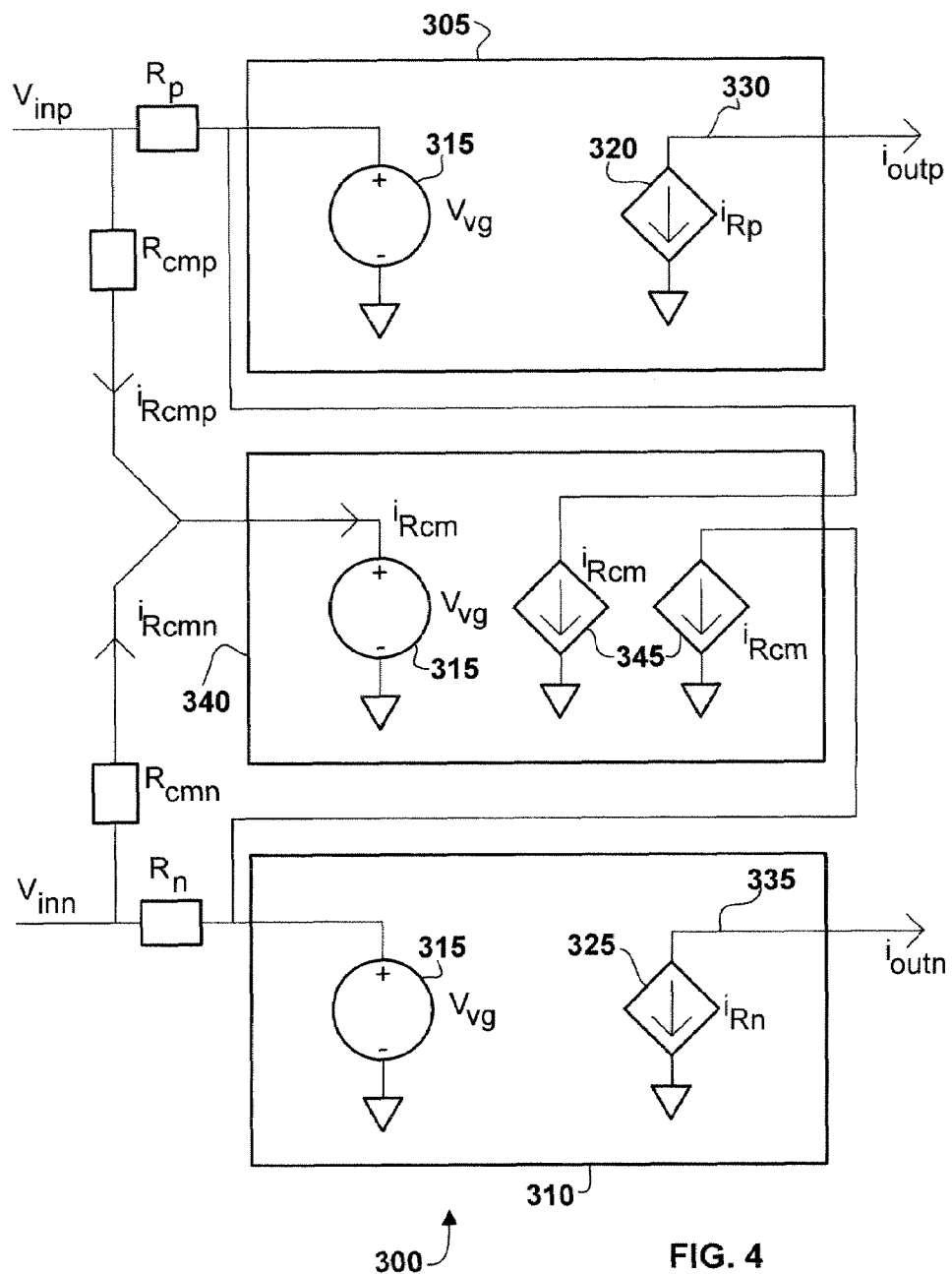
FIG. 4 is a conceptual illustration of alternative embodiments of the transconductor illustrated in FIG. 3.

FIG. 4 is a conceptual illustration of alternative embodiments of Transconductor 300 including common-mode compensation. In these embodiments, the current $i_{Rcm}$ is subtracted from the currents $i_{Rn}$ and $i_{Rp}$ at the virtual ground node inputs of the Current-copying Components 305 and 310, respectively. In contrast with the embodiments illustrated in FIG. 3, the polarity of the currents generated by the two Current Sources 345 are reversed. The embodiments of Transconductor 300 illustrated in FIG. 4 result in outputs $i_{outn}$ and $i_{outp}$ that are independent of the common-mode voltage. This result can be demonstrated using the analysis as discussed with respect to FIG. 3, as will be apparent to one of ordinary skill in the art.

Figure 5:
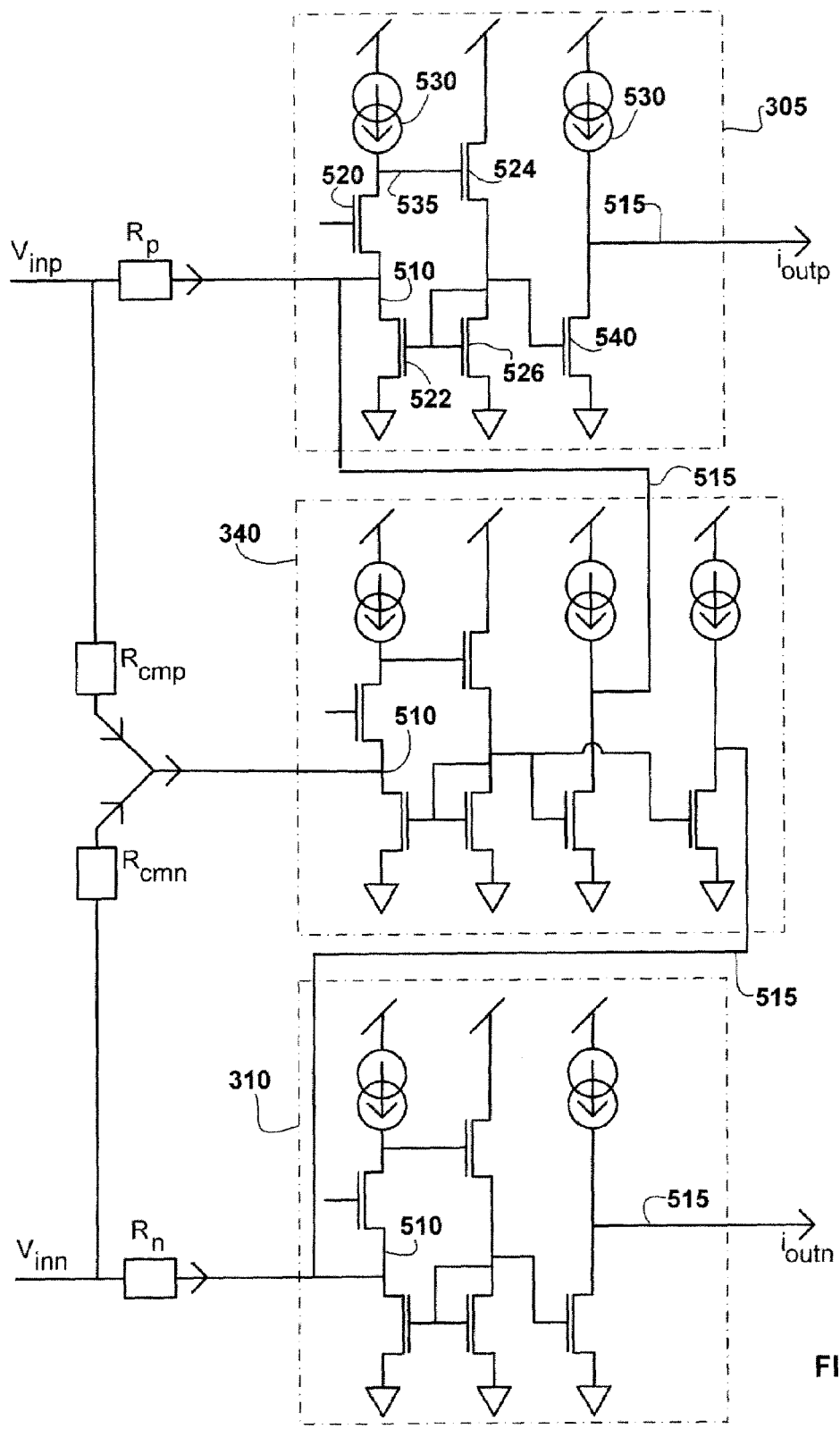
FIG. 5 is a circuit diagram illustrating some embodiments of the transconductor illustrated in FIG. 4, according to various embodiments of the invention.

FIG. 5 is a circuit diagram illustrating some embodiments of the transconductor illustrated in FIG. 4. Current-copying Components 305, 310 and 340 each include a gm-boosted current copier configured to create a Virtual Ground Node 510 and circuitry configured to reproduce the current received at the virtual ground node at one or more respective Outputs 515. Current-copying Component 340 includes two of Outputs 515. The currents at the two Outputs 515 of Current-copying Component 340 are combined with the currents $R_n$ and $R_p$ at the Virtual Ground Nodes 510 of Current-copying Components 310 and 305, respectively, to compensate for the common-mode voltage of $V_{inp}$ and $V_{inn}$. It will be apparent, with the benefit of this specification, to one of ordinary skill in the art that other alternative circuits may be used to implement the embodiments illustrated herein.

The current copier of Current-copying Component 305 comprises Transistors 520, 522, 524 and 526 and a Current Source 530 connected to the drain of Transistor 520. Current-copying Component 305 may be a gm-boosted current copier or more generally a low-impedance-input current copier. A circuit is said to have low-impedance input when the voltages of its input terminals change by a tolerably amount when current is injected into those terminals. The source of Transistor 520 is the input of a common-gate amplifier. Transistor 520 has a fixed gate-bias voltage. A Node 535 between Current Source 530 and the drain of Transistor 520 is a high-impedance node that amplifies any variation of voltage at the source of Transistor 520. Node 535 is connected to the gate of Transistor 524 such that the voltage variation is converted to a current variation. This current variation is fed back to the input using a current mirror comprising Transistors 522 and 526. This results in a negative-feedback loop which keeps the voltage on the source of Transistor 520 virtually constant for a range of possible values of the input current $i_{Rp}$. A fixed-bias current supplied by Current Source 530 flows through Transistor 520 and, thus, the input current $i_{Rp}$ and this bias current flow through the channel of Transistor 522. The input Current $i_{Rp}$ is the difference between the fixed-bias current supplied by Current Source 530 and the current through the channel of Transistor 522. Because of the current-mirror configuration of transistors 522 and 526, the same current flows through the channels of Transistor 522 and Transistor 526. Other current-copiers, with or without gm-boosting, which can be used in this invention will be apparent to those of ordinary skill in the art.

The output $i_{outp}$ is generated using a Transistor 540. The drain of Transistor 540 is connected to a second instance of Current Source 530 configured to provide the same bias current as the first instance of Current Source 530. Transistor 540 and Transistors 522 and 526 have the same gate-source voltage and, thus, the same drain current. Therefore, the output current $i_{outp}$ is the difference between the bias current supplied by Current Source 530 and the current through the channel of Transistor 540. Because the current through the channel of Transistor 540 (the drain current) is the same as the current through the channel of Transistor 522, the output current $i_{outp}$ will be the same as the input current $i_{Rp}$.

Current-copying Components 310 and 340 operate using a similar set of circuits. Current-copying Component 340 includes additional instances of Current Source 530 and Transistor 540 such that two outputs are produced. These two outputs are used as feedback (or forward) to Current-copying Components 305 and 310 as, for example, illustrated in FIG. 4.

Figure 6:
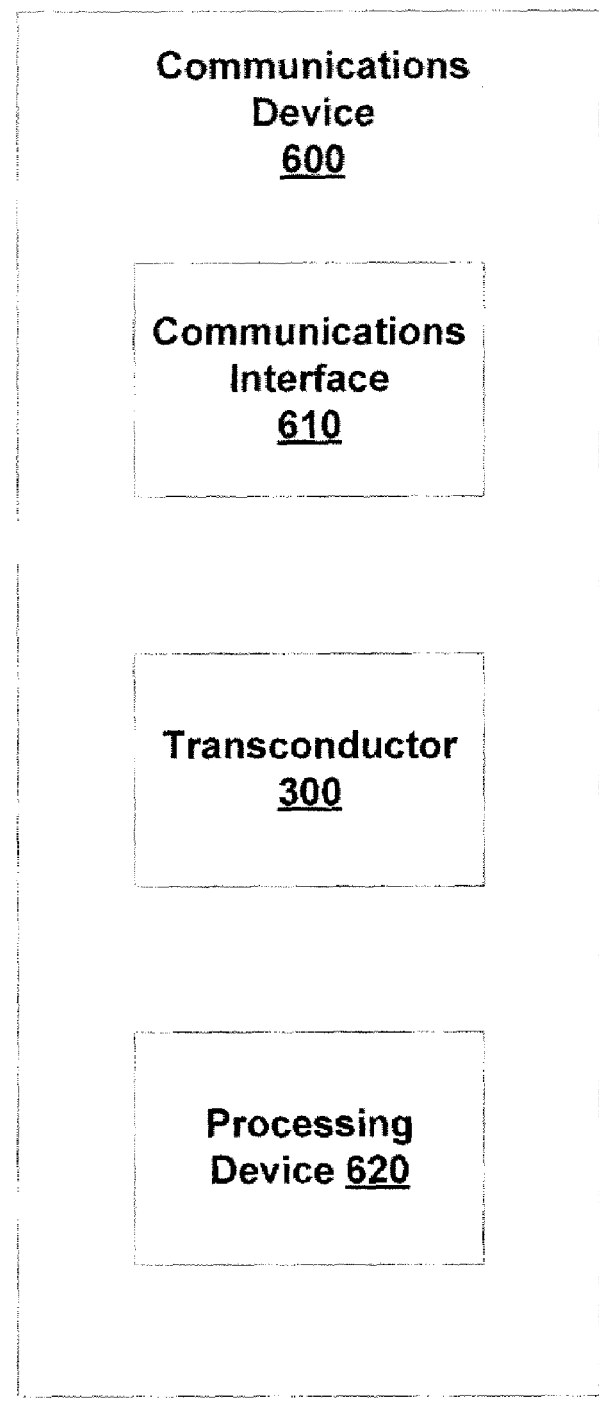
FIG. 6 illustrates a communication system including a transconductor, according to various embodiments of the invention.

FIG. 6 illustrates a Communication System 600 including Transconductor 300, according to various embodiments of the invention. In addition to Transconductor 300, Communication System 600 comprises a Communications Interface 610 and a Processing Device 620. Communication System 600 is configured to receive a communication signal via Communications Interface 610, to generate currents representative of voltages within the received communication signal, and to process these currents using Processing Device 620. The communication signal may be digital or analog and may come from a wide variety of sources. For example, the communication signal may include electro-magnetic radiation such as radio signals, radar, microwaves, or the like. The signal may alternatively comprise infrared light, visible light, or the like. The signal may alternatively comprise electrical signals transmitted over electrical conductors. The signal may include sonar, mechanical vibrations, pressure, or the like. Communication System 600 is one of many possible applications to which Transconductor 300 may be applied.

Communications Interface 610 is configured to receive the communication signal and provide the signal as a voltage to the inputs of Transconductor 300. Communication Interface 610 may include an antenna, photon detector, chemical sensor, magnetic sensor, force sensor, motion sensor, microphone, powerline communication interface, electrical connector coupler (e.g., Ethernet, USB, serial port, parallel port, bus, etc.), or the like. For example, in some embodiments Communication Interface 610 includes the various powerline communication interfaces disclosed in U.S. Patent applications 12/075,888, 12/144,511, 11/493,292 or 11/752,865, the disclosures of which are hereby incorporated herein by reference. Communication Interface 610 may be configured to receive analog and/or digital signals.

Transconductor 300 is configured to receive a signal voltage from Communication Interface 610 and provide a current proportional to the signal to Processing Device 620. In various embodiments, proportionality is maintained as the signal varies over at least 40, 50, 60 or 70 dB.

Processing Device 620 may be digital or analog. For example, in some embodiments Processing Device 620 includes an analog speaker configured to make a sound responsive to the received signal. In other embodiments, Processing Device 620 includes an integrated circuit, active and/or passive components, memory, or the like. For example, in some embodiments Processing Device 620 includes a processor configured to interpret the received signals and perform logical operations in response (e.g., execute computing instructions stored in hardware, firmware, and/or software). Processing Device 620 optionally includes an analog-to-digital converter configured to generate a digital value representative of a difference between $V_{inp}$ and $V_{inn}$ responsive to $I_{outn}$ and $I_{outp}$. Processing Device 620 optionally includes a current-to-voltage converter configured to convert to $I_{outn}$ and $I_{outp}$ to a proportional voltage.

Figure 7:
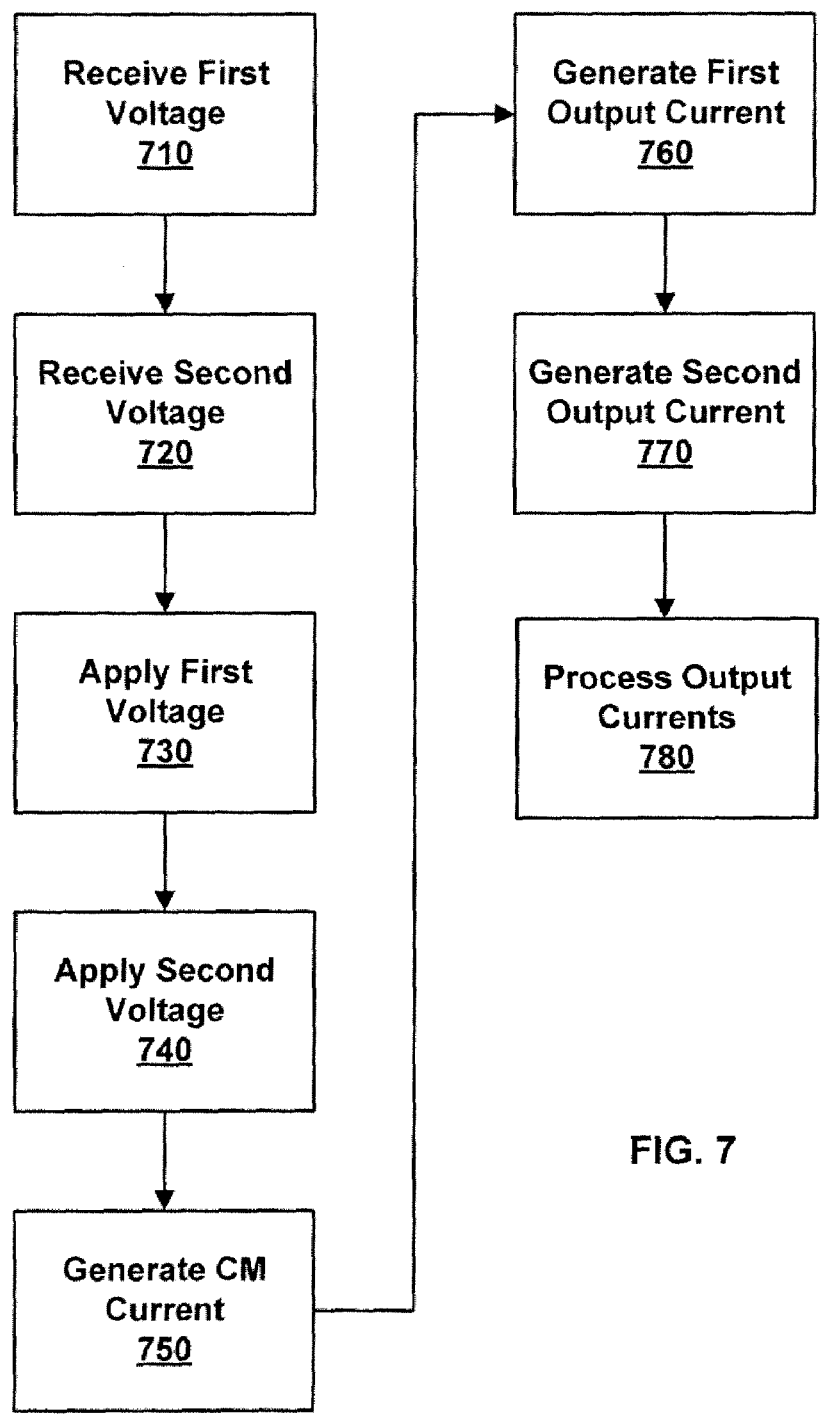
FIG. 7 illustrates methods of generating currents proportional to received voltages, according to various embodiments of the invention.

FIG. 7 illustrates methods of generating currents proportional to received voltages, according to various embodiments of the invention. In a Receive First Voltage Step 710, a first voltage is received by Transconductor 300 optionally from Communications Interface 610. In a Receive Second Voltage Step 720, a second voltage is received by Transconductor 300 optionally from Communications Interface 610. A difference between the first voltage and the second voltage may represent a signal received via Communications Interface 610. Receive First Voltage Step 710 and Receive Second Voltage Step 720 may include communicating a signal (and associated voltages) from a power line, a telephone line, a cable system, an antenna, a coax cable, and/or the like to the inputs of Transconductor 300 optionally using Communications Interface 610. As described elsewhere herein, this signal may be analog or digitally encoded.

In an Apply First Voltage Step 730 the first received voltage is applied to $V_{inp}$ to generate a current through a resistor, e.g., $i_{Rp}$ through $R_p$. This current is typically a function of a virtual ground voltage $V_{vg}$ established using Voltage Source 315.

In an Apply Second Voltage Step 740 the second received voltage is applied to $V_{inn}$ to generate a current through a resistor, e.g., $i_{Rn}$ through $R_n$. This current is typically a function of the virtual ground voltage $V_{vg}$.

In a Generate CM Current Step 750 a common-mode current $i_{Rcm}$ generated using Transconductor 300. This current is representative of the common-mode voltage of the first received voltage and the second received voltage. In some embodiments, $i_{Rcm}$ is generated by applying $V_{inp}$ and $V_{inn}$ to resistors $R_{cmp}$ and $R_{cmn}$, respectively, and combining the resulting currents.

In a Generate First Output Current 760, a first output current $i_{outp}$, is generated using the current generated in Apply First Voltage Step 730 and the common-mode current $i_{Rcm}$ generated in Generate CM Current Step 750. This current may be generated by feeding forward or feeding back $i_{Rcm}$, as described elsewhere herein.

In a Generate Second Output Current 770, a second output current $i_{outn}$ is generated using the current generated in Apply Second Voltage Step 740 and the common-mode current $i_{Rcm}$ generated in Generate CM Current Step 750. This current may be generated by feeding forward or feeding back $i_{Rcm}$, as described elsewhere herein.

In an optional Process Output Currents Step 780 the first and second output currents are processed using Processing Device 620. The processing optionally includes conversion of the currents to voltages, decoding digitally encoded signals, execution of software, hardware or firmware responsive to the currents, conversion of the signals to digital data, and/or the like.

Several embodiments are specifically illustrated and/or described herein. However, it will be appreciated that modifications and variations are covered by the above teachings and within the scope of the appended claims without departing from the spirit and intended scope thereof. For example, in some embodiments Communications Device 600 and/or Transconductor 300 are embodied on a single chip. This chip may be configured to employ low-voltage technology, e.g., CMOS technology.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
   a first voltage input;
   a second voltage input;
   a first voltage-to-current converter comprising:
     a first circuit configured to provide a virtual ground,
     an input resistor $R_p$ disposed between the first voltage input and the virtual ground, and
     a circuit configured to generate an output current $I_{outp}$ responsive to current flowing through the resistor $R_p$;
   a second voltage-to-current converter comprising:
     a second circuit configured to provide the virtual ground,
     an input resistor $R_n$ disposed between the second voltage input and the virtual ground, and
     a circuit configured to generate an output current $I_{outn}$ responsive to current flowing through the resistor $R_n$;
   a third voltage-to-current converter comprising:
     a third circuit configured to provide the virtual ground,
     an input resistor $R_{cmp}$ disposed between the first voltage input and the virtual ground,
     an input resistor $R_{cmn}$ disposed between the second voltage input and the virtual ground, and
     a circuit configured to combine currents flowing through the input resistors $R_{cmp}$ and $R_{cmn}$, and to generate an output current $I_{Rcm}$ proportional to the combined currents; and
   a circuit configured to provide the output current $I_{Rcm}$ to the first voltage-to-current converter and the second voltage-to-current converter so as to compensate for a common-mode voltage between the first voltage input and the second voltage input.

2. The system of claim 1, wherein the circuit configured to provide the output current $I_{Rcm}$ to the first voltage-to-current converter is configured to provide the output current to the output of the first voltage-to-current converter.

3. The system of claim 1, wherein the circuit configured to provide the output current $I_{Rcm}$ to the first voltage-to-current converter is configured to provide the output current to the first voltage-to-current converter at a point between the input resistor $R_p$ and the virtual ground.

4. The system of claim 1, wherein the input resistors $R_{cmp}$ and $R_{cmn}$ have approximately the same resistance.

5. The system of claim 1, wherein the input resistors $R_{cmp}$ and $R_{cmn}$ have approximately twice the resistance of the input resistors $R_n$ and $R_p$.

6. The system of claim 1, further including a current-to-voltage converter configured to receive the output currents $I_{outn}$ and $I_{outp}$ and generate a voltage proportional to a difference between these currents.

7. The system of claim 1, further including an analog-to-digital converter configured to generate a digital value representative of a difference between $V_{inp}$ and $V_{inn}$, responsive to the output currents $I_{outn}$ and $I_{outp}$.

8. The system of claim 1, wherein the circuit configured to generate an output current $I_{outp}$ responsive to current flowing through the resistor $R_p$ is configured to generate output current $I_{outp}$ proportional to current flowing through the resistor $R_p$.

9. The system of claim 1, wherein the circuit configured to generate an output current $I_{outp}$ responsive to current flowing through the resistor $R_p$ is configured to generate output current $I_{outp}$ proportional to current flowing through the resistor $R_p$ combined with the output current $I_{Rcm}$.

10. The system of claim 1, wherein the circuit configured to provide the output current $I_{Rcm}$ to the first voltage-to-current converter is configured to do so at the output of the first voltage-to-current converter.

11. The system of claim 1, further comprising an interface configured to receive a signal from a power line and provide the signal across the first voltage input and the second voltage input.

12. The system of claim 1, further comprising an interface configured to receive a signal from a telephone line or cable line and provide the signal across the first voltage input and the second voltage input.

13. The system of claim 1, wherein the virtual ground is established using a gm-boosting loop.

14. A system comprising:
means for receiving a first input voltage and generating a first output current using the first input voltage;
means for receiving a second input voltage and generating a second output current using the second input voltage;
means for generating a common-mode current representative of a common-mode voltage between the first input voltage and the second input voltage; and
means for providing the common-mode current to the means for generating a first output current and to the means for generating a second output current, such that the first output current and the second output current are compensated for the common-mode voltage.

15. The system of claim 14, further including an interface configured to receive a signal from a power line and to provide the received signal to the means for receiving a first input voltage.

16. The system of claim 14, wherein the means for receiving a first input voltage and generating a first output current includes a circuit configured to establish a virtual ground.

17. A method comprising the steps of:
receiving a first voltage at a first input;
applying the first voltage to a first input resistor to generate a first input current;
receiving a second voltage at a second input;
applying the second voltage to a second input resistor to generate a second input current;
generating a common-mode current representative of a common-mode voltage of the first voltage and the second voltage;
using the first input current and the common-mode current to generate a first output current; and
using the second input current and the common-mode current to generate a second output current, a difference between the first output current and the second output current being proportional to a difference between the first voltage and the second voltage.

18. The method of claim 17, further comprising communicating the first voltage from a power line to the first input.

19. The method of claim 17, wherein the first voltage and second voltage are part of a digitally encoded signal, and further including receiving the digitally encoded signal via a telephone line, a cable system, an antenna, or a coax cable.

20. The method of claim 17, further comprising converting the first output current and the second output current to digital data and communicating the digital data to a computing system.

21. The method of claim 17, wherein using the first input current and the common-mode current to generate the first output current comprises combining the first input current and the common-mode current at a virtual ground node.

22. The method of claim 17, wherein using the first input current and the common-mode current to generate the first output current comprises combining the first input current and the common-mode current at the output of a current-copying circuit.

* * * * *